United States Patent [19]
Chang-Hasnain et al.

[11] Patent Number: 5,629,951
[45] Date of Patent: May 13, 1997

[54] ELECTROSTATICALLY-CONTROLLED CANTILEVER APPARATUS FOR CONTINUOUS TUNING OF THE RESONANCE WAVELENGTH OF A FABRY-PEROT CAVITY

[76] Inventors: Constance J. Chang-Hasnain, 837 Allardice Way, Stanford, Calif. 94309; Edward C. Vail, 117 Cowper St., Palo Alto, Calif. 94305; Marianne S. Wu, P.O. Box 10233, Stanford, Calif. 94309

[21] Appl. No.: 542,057

[22] Filed: Oct. 13, 1995

[51] Int. Cl.$^6$ ............................................. H01S 3/10
[52] U.S. Cl. ........................... 372/20; 372/32; 372/96
[58] Field of Search .................... 372/92, 96, 20, 372/32, 107

[56] References Cited

U.S. PATENT DOCUMENTS

| 5,022,745 | 6/1991 | Zayhowski et al. ............. 359/847 |
| 5,291,502 | 3/1994 | Pezeshki et al. ................. 372/20 |

FOREIGN PATENT DOCUMENTS

| 0-108-562 | 5/1984 | European Pat. Off. ............. 372/90 |
| 63-250888 | 10/1988 | Japan ............................. 372/43 |

OTHER PUBLICATIONS

Vail, E.C. et al., "GaAs micromachined widely tunable Fabry–Perot filters", Elect. Lett. 31(3), 2 Feb. 1995, pp. 228–229.

Wu, M.S. et al., "Tunable micromachined vertical cavity surface emitting laser", Elect. Lett., 31(19), 14 Sep. 1995, pp. 1671–1672.

*Primary Examiner*—Rodney B. Bovernick
*Assistant Examiner*—Robert E. Wise
*Attorney, Agent, or Firm*—Lumen Intellectual Property Services

[57] ABSTRACT

An electrostatically controlled cantilever apparatus for continuous tuning of the resonance wavelength of a Fabry-Perot cavity is disclosed. A resonant cavity is formed between two distributed Bragg reflector (DBR) mirrors. The top reflector is composed of a movable top DBR supported in a freely suspended cantilever, a variable-thickness air spacer layer and a fixed DBR. The bottom reflector is fixed on the substrate. By applying a tuning voltage to create electrostatic attraction, the cantilever may be deflected towards the substrate, thereby changing the thickness of the air spacer layer and consequently the resonant wavelength of the Fabry-Perot cavity.

25 Claims, 9 Drawing Sheets

ELECTROSTATICALLY-CONTROLLED CANTILEVER APPARATUS FOR CONTINUOUS TUNING OF THE RESONANCE WAVELENGTH OF A FABRY-PEROT CAVITY

This invention was made with Government support under contract no. NSF-2MWF248, awarded by the National Science Foundation (NSF). The Government has certain rights in the invention.

BACKGROUND—FIELD OF THE INVENTION

The present invention relates to the field of Fabry-Perot microcavities where a cantilever structure is used to change the cavity length and hence the resonance wavelength.

BACKGROUND—DESCRIPTION OF PRIOR ART

Optical communications systems promise to revolutionize the field of telecommunications. However, numerous technological obstacles loom in the way. Prominent among these is the lack of wavelength selective optical filters, sources, and receivers which have a narrow spectral linewidth and whose wavelength of operation may be tuned by a control parameter. In other words, there are no suitable structures and/or methods for adjusting the resonant wavelength of a single-mode optical cavity.

A number of schemes have been proposed and studied to obtain frequency tuning of semiconductor lasers. These methods have typically relied on tuning the index of refraction of the optical cavity. Such index adjustment can be induced by heating, the electro-optic effect and carrier injection. However, the index variance is relatively small. The resulting tunable range is restricted to approximately 10 nm.

In addition, the bulk of these tuning schemes have been attempted with edge emitting laser structures. Unlike vertical cavity surface emitting lasers (VCSEL), these structures are not inherently single-mode and consequently the use of distributed Bragg reflectors or distributed feedback, both of which are difficult to fabricate, are required to select a single mode.

Interferometric techniques which rely on variable selection of different Fabry-Perot modes from a comb of modes have also been proposed. Among these are asymmetric y-branch couplers and vertical cavity filters. These methods produce tuning ranges of up to 100 nm. They are, however, restricted to discrete tuning only and are potentially unstable between the tuning steps.

Most of the above mentioned techniques are polarization-sensitive. This means that they cannot be easily adapted to optical communications systems which need to be robust and inexpensive and consequently insensitive to beam polarization.

Finally, the need for widely wavelength tunable optical devices is largely motivated by the demands of wavelength division multiplexed communication systems. A critical and costly problem in these systems is the need for exact wavelength registration between transmitters and receivers. A tunable receiver capable of locking to the incoming signal over a range of wavelength variation would relax the extremely stringent wavelength registration problem.

Further, the wavelength tracking tunable receiver could also function as a cost-effective wavelength meter.

The idea of electrostatically deflecting the top reflector in a VCSEL has previously been proposed by Pezeshki et al. in U.S. Pat. No. 5,291,502. However, their proposal focuses on suspended membranes which are intrinsically sensitive to stress gradients since no expansion or contraction of the suspended layer can be accommodated. Further, their proposal focuses on the idea of a suspended aluminum layer which may in itself form the mirror or the last layer of a multi-layer mirror. The wavelength tracking capability has not been previously discussed.

OBJECTS AND ADVANTAGES OF THE INVENTION

In view of the above, it is an object of the present invention to provide an apparatus for tuning the resonance wavelength of a Fabry-Perot cavity in a continuous manner over a wide range of wavelengths. A further object of the invention is to provide for such apparatus to operate as a laser, detector or filter. It is another object that the tunable detector may operate with wavelength tracking of the incident source and may function as a wavelength meter. Yet another object of the invention is to ensure that such apparatus is polarization-insensitive. It is another object of the invention that this apparatus be simple in construction, easy to control and straightforward to manufacture.

These and other objects and advantages will become more apparent after consideration of the ensuing description and the accompanying drawings.

SUMMARY OF THE INVENTION

The objects and advantages of the invention are achieved with an electrostatically controlled cantilever apparatus. A resonant cavity is formed between two distributed Bragg reflector (DBR) mirrors. The top reflector is composed of a movable top DBR supported in a freely suspended cantilever, a variable-thickness air spacer layer and a fixed DBR. The bottom reflector is fixed on the substrate. By applying a tuning voltage to create electrostatic attraction, the cantilever may be deflected towards the substrate, thereby changing the thickness of the air spacer layer and consequently the resonant wavelength of the Fabry-Perot cavity.

The invention is explained in detail in the description with reference to the attached drawing figures.

DESCRIPTION

Figure 1A:
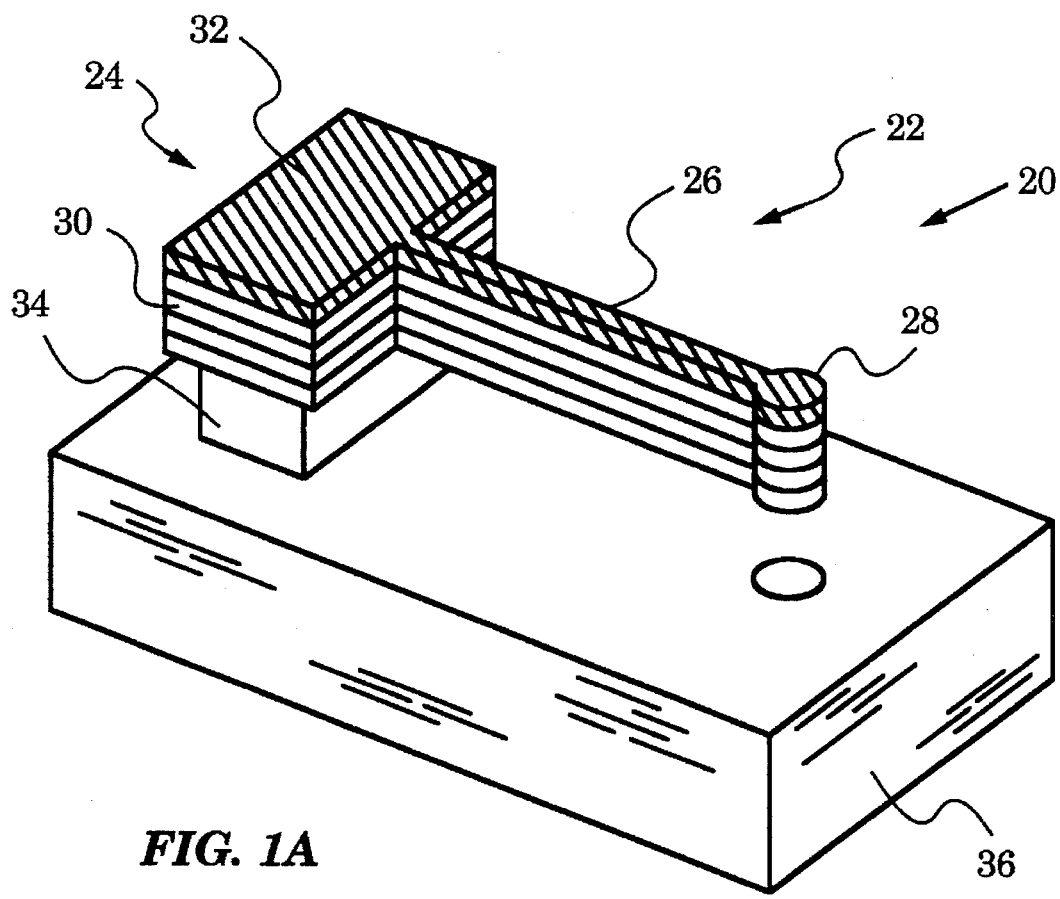
FIG. 1A is a perspective view of a single-arm cantilever apparatus according to the invention.

In the most basic embodiment, a cantilever apparatus according to the present invention makes use of an electrostatic force pulling on a simple cantilever arm. The mechanical deflection resulting from this electrostatic force can be used to change the length of the Fabry-Perot microcavity and consequently to tune the resonance wavelength. FIG. 1A shows a simple embodiment of such an apparatus in perspective.

In particular, a cantilever apparatus 20 has a cantilever structure 22 consisting of a base 24, an arm 26 and an active head 28. In the embodiment shown, the bulk of cantilever structure 22 consists of four reflective layers 30 which form a distributed Bragg reflector (DBR). It is preferable to make layers 30 of AlGaAs. Different compositional ratios are used for individual layers 30, e.g., $Al_{0.09}Ga_{0.91}As/Al_{0.58}Ga_{0.42}As$. The topmost layer 30 is heavily doped to ensure good contact with an electrical tuning contact 32 deposited on top of cantilever structure 22.

The actual number of layers 30 may vary from 1 to 20 and more, depending on the desired reflectivity of DBR 30. Furthermore, any suitable reflecting material other than AlGaAs may be used to produce layers 30. A person skilled in the art will be able to chose the right materials and dimensional parameters for layers 30. Finally, it is not even necessary that arm 26 or base 24 be made up of layers 30, as long as active head 28 includes the layers.

In the embodiment shown base 24 is rectangular and suitably large to ensure dimensional stability of cantilever structure 22. The width of arm 26 ranges typically from 2 to 8 μm while its length is 25 to 100 μm or more. The cantilever stiffness increases as its length decreases. Consequently, shorter cantilevers require greater forces to achieve bending but shorter cantilevers also resonate at a higher frequency. The preferred diameter of active head 28 falls between 5 and 40 μm. Of course, other dimensions are also possible and a person skilled in the art will be able to compute them according to the requirements at hand.

Electrical tuning contact 32 resides on top of cantilever structure 22. In this embodiment, tuning contact 32 is made of gold and covers the entire top surface of cantilever structure 22. However, any other electrically conducting material can be used and it is not necessary that the entire top surface of cantilever structure 22 be covered. The only limitation is that tuning contact 32 be sufficiently large to allow application of a first tuning voltage $V_{t1}$ as discussed below.

Base 24 rests on a support block 34 across which a voltage can be sustained. In this case, block 34 is composed of GaAs. Block 34, in turn, sits on an electrically responsive substrate 36, preferably made of suitably doped GaAs. A voltage difference between layers 30 and substrate 36 causes a deflection of arm 26 towards substrate 36. If layers 30 and substrate 36 are oppositely doped, then a reverse bias voltage can be established between them. Substrate 36 is sufficiently thick to provide mechanical stability to entire cantilever apparatus 20. Inside substrate 36 and directly under active head 28 are lodged one or more sets of reflective layers with each set forming a second DBR.

Figure 1B:
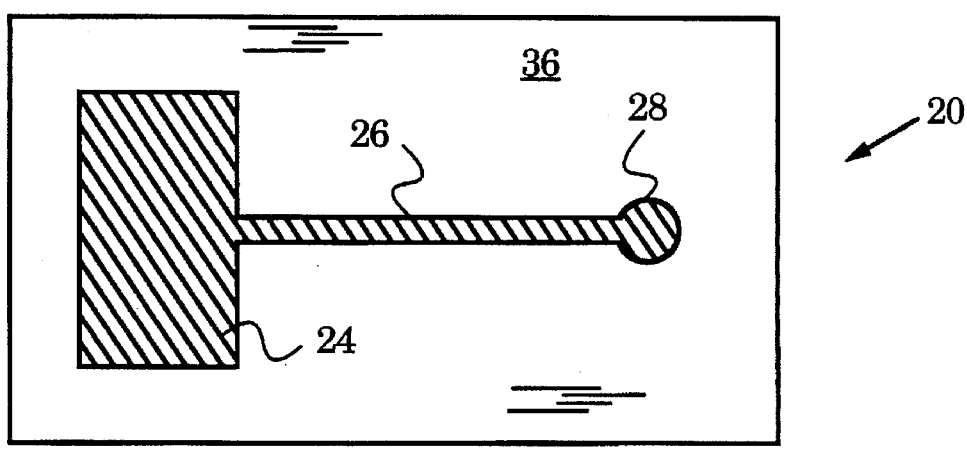
FIG. 1B is a top view of the cantilever apparatus shown in FIG. 1A.
Figure 1C:
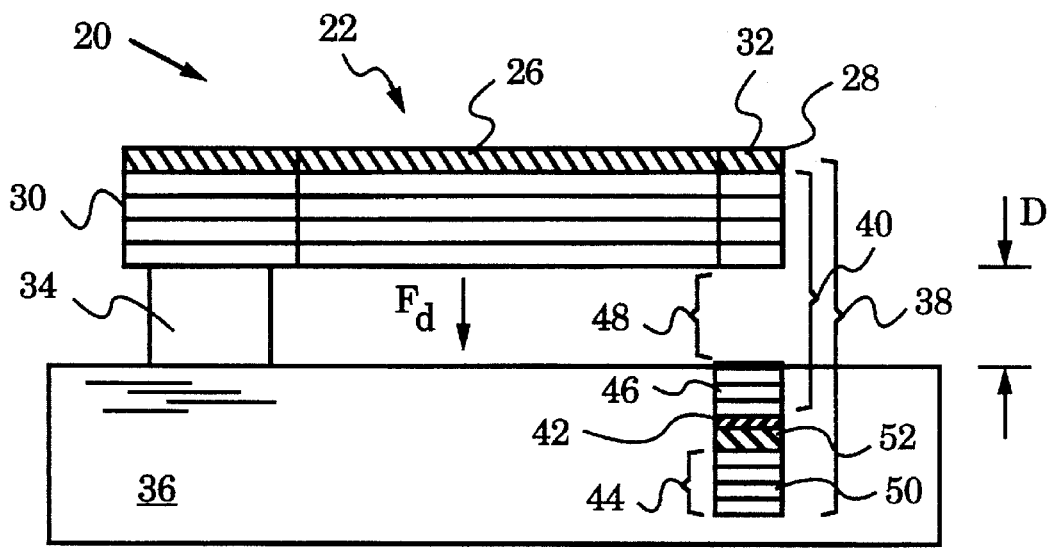
FIG. 1C is a side view of the cantilever apparatus of FIG. 1A.

As shown in FIG. 1C, a Fabry-Perot cavity 38 is formed by a top-reflector 40, an active region or medium 52, a conventional cavity spacer layer 42, and a bottom reflector 44. Top reflector 40 is formed by DBR layers 30, an air gap 48, which acts as a DBR layer, and a second set of reflective layers 46 in substrate 36. In other words, top-reflector 40 is composed of two semiconductor portions sandwiching tunable air gap 48. The first semiconductor portion is contained in active head 28 in the form of layers 30. The second semiconductor portion, consisting of layers 46, is lodged inside substrate 36.

Bottom reflector 44 is composed of four reflecting layers 50. Just as in the case of layers 30, the number of layers 50 will vary depending on the desired reflectivity of bottom reflector 44. If, as in a filter, no active region or spacer layer is required, the top reflector may be composed of only the top DBR layers 30. In this case, air gap 48 may itself form the spacer layer, and the bottom reflector is formed by layers 50.

In a Fabry-Perot cavity such as cavity 38, the total number of layers similar to layers 46 can vary from none to several tens. If no active layer is needed, tunable air gap 48 can itself form the spacer layer and the top reflector can be formed entirely from layers 30 lodged in active head 28. However, where an active layer is required, such as in a laser or in a detector, tunable air gap 48 and the cavity spacer layer such as layer 42 may be distinct and independent. In this case, at least one of layers 46 is required. The actual number of layers 46 depends on the number of layers 30, the desired reflectivity, the desired tuning range, and other well-known optical parameters of the apparatus. However, in any cantilever apparatus similar to apparatus 20, active head 28 has to contain at least one layer 30.

The remaining part of Fabry-Perot cavity 38 consists of a conventional cavity spacer 42, active medium 52, and four reflecting layers 50. The latter constitute bottom reflector 44. Just as in the case of layers 30 and 46, the number of layers 50 will vary depending on the desired reflectivity of bottom reflector 44.

As indicated in FIG. 1C, the height of block 34 is 1.2 μm; thus cantilever structure 22 is situated a distance D=1.2 μm above substrate 36. Of course, block 34 can be placed significantly higher or lower, depending on the desired tuning range.

The operation of cantilever apparatus 20 is best visualized in FIG. 1C. To tune Fabry-Perot cavity 38 a first tuning voltage $V_{t1}$ is applied to tuning contact 32. The application of $V_{t1}$ results in charge accumulation on contact 32 and cantilever structure 22. The charge on contact 32 and structure 22 causes an equal and opposite charge to amass at the surface of electrically responsive substrate 36. The two attracting charges produce a vertical force $F_d$ acting on arm 26 and active head 28. Vertical force $F_d$ causes arm 26 to deform and distance D to decrease.

As distance D decreases so does the effective length of Fabry-Perot cavity 38. A change in cavity length alters the resonance wavelength of the cavity. Thus, decreasing distance D results in a decrease in the resonance wavelength of the Fabry-Perot micro-cavity. Furthermore, since distance D is a continuous function of tuning voltage $V_{t1}$, and since $V_{t1}$ can be adjusted continuously, the tuning of the wavelength is continuous. For a specific filter structure, the resonance wavelength was tuned over 70 nm by applying 4.9 V. In particular, when $V_{t1}$=4.9 V the deflection of arm 26 was 0.33 μm (D=0.87 μm) and the resonance wavelength was reduced from 970 nm (at D=1.2 μm) to 900 nm.

Because active head 28 is nearly circularly symmetric, cantilever apparatus 20 is polarization-insensitive and thus well-suited for applications in optical telecommunications systems. Apparatus 20 is also simple in construction and easy to control.

The above-described embodiment is based on a very simple cantilever structure. While the embodiment described above suitably demonstrates the basic principles of the present invention, refinements of the above-described structure may be necessary to address the excess intensity losses caused by the tilt of the active head. Because arm 26 is long relative to the vertical displacement of head 28, the tilt angle is small. However, optimal device performance require refinements which address the loss due to the tilt of the active head. Variations of the basic embodiment which provide tilt compensation are discussed below.

Figure 2A:
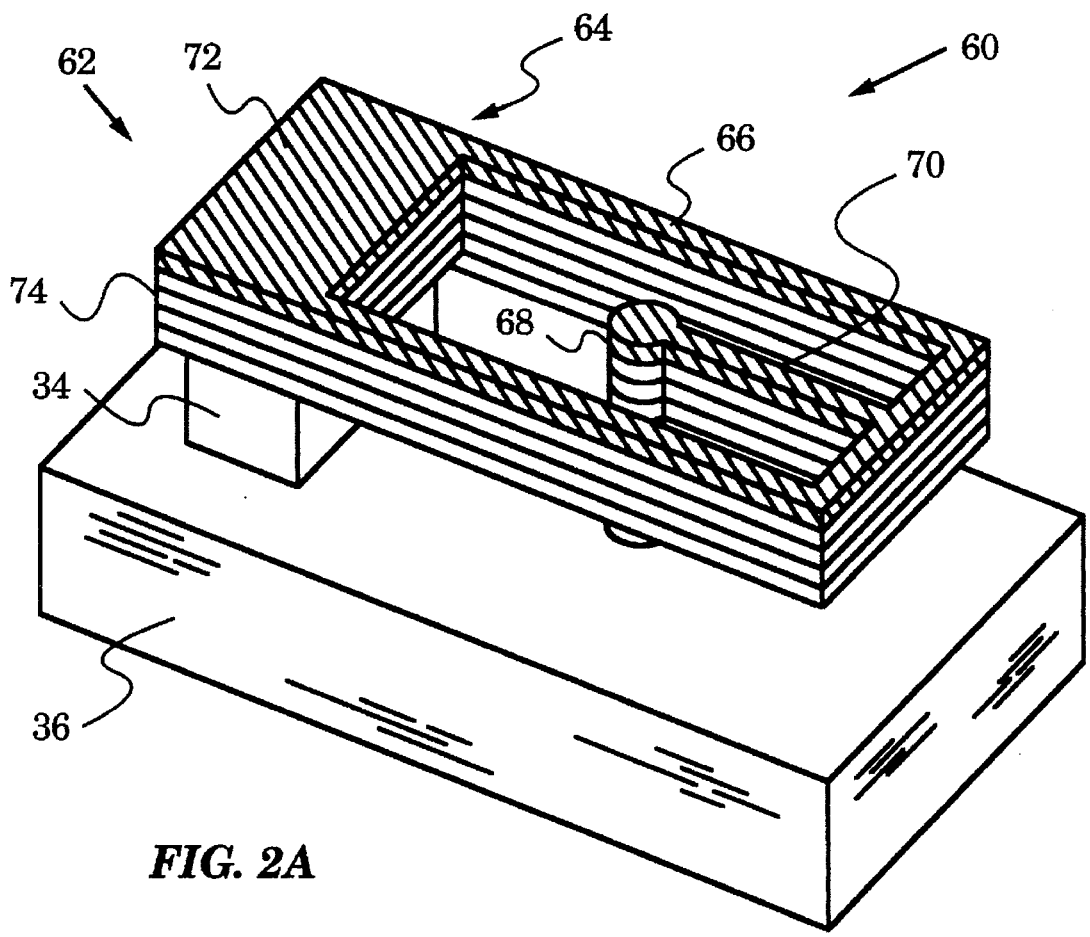
FIG. 2A is a perspective view of a cantilever apparatus according to the invention having a rectangular circumference and an in-reaching portion.

One method to counteract the tilt of the active head is to use a cantilever structure which "doubles-back" upon itself. A preferred embodiment of such a cantilever apparatus 60 is shown in perspective in FIG. 2A. It consists of a more complex cantilever structure 62 made up of a base 64, a deformable section 66, and an active head 68. As in the first embodiment, base 64 is rectangular. Deformable section 66 is a rectangular circumference with an in-reaching portion 70. Portion 70 projects into the central passage from the side of rectangular circumference opposite base 64. Active head 68 is located at the end of in-reaching portion 70.

Deformable section 66 is preferably between 50 and 100 μm in length and 25 to 75 μm in width with a central passage measuring from 2 to 6 μm less in length and width. The length of in-reaching portion 70 varies from 10 μm to 75 μm and its width falls between 2 and 8 μm. The size of active head 58 is preferably the same as in the first embodiment. Of course, other dimensions are also possible and a person skilled in the art will be able to compute them according to requirements at hand.

An electrical tuning contact 72 covers the top or some portion of the top of cantilever structure 62. Preferably, tuning contact 72 is made of gold, although other conductors can be used as well. It should be noted that the cantilever is conductive. Meanwhile, the bulk of cantilever structure 62 is constituted of the four reflecting layers 74.

Figure 2B:
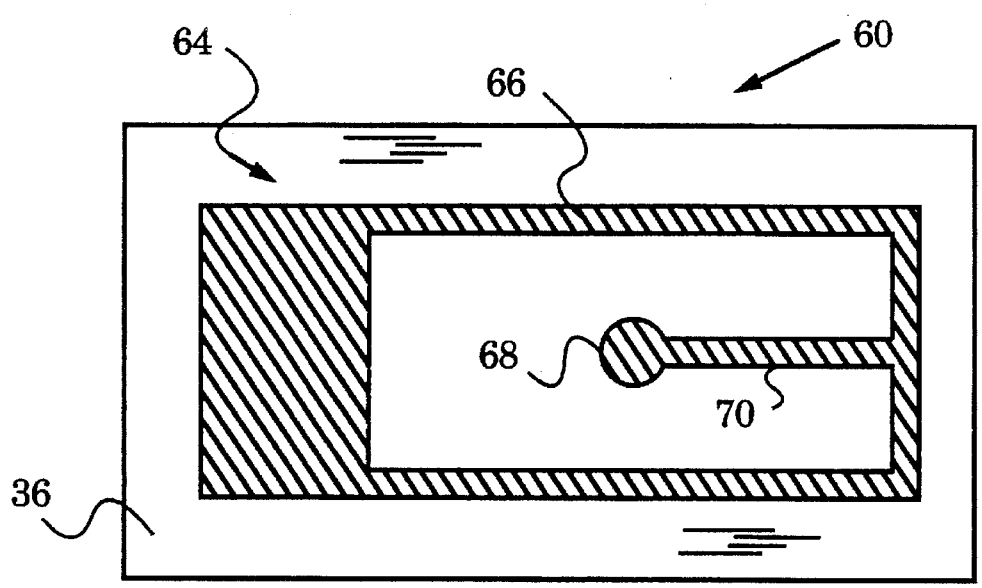
FIG. 2B is a top view of the cantilever of FIG. 2A.

Base 64 rests on support block 34, across which a voltage may be applied. Block 34 sits on electrically responsive substrate 36, as described in the embodiment shown in FIG. 1. The alignment of active head 68 with Fabry-Perot cavity 38 is 15 clear from the top view of cantilever apparatus 60 in FIG. 2B. Furthermore, as shown in the side view of FIG. 2C, Fabry-Perot cavity 38 has all the components described above in reference to the first embodiment.

Figure 2C:
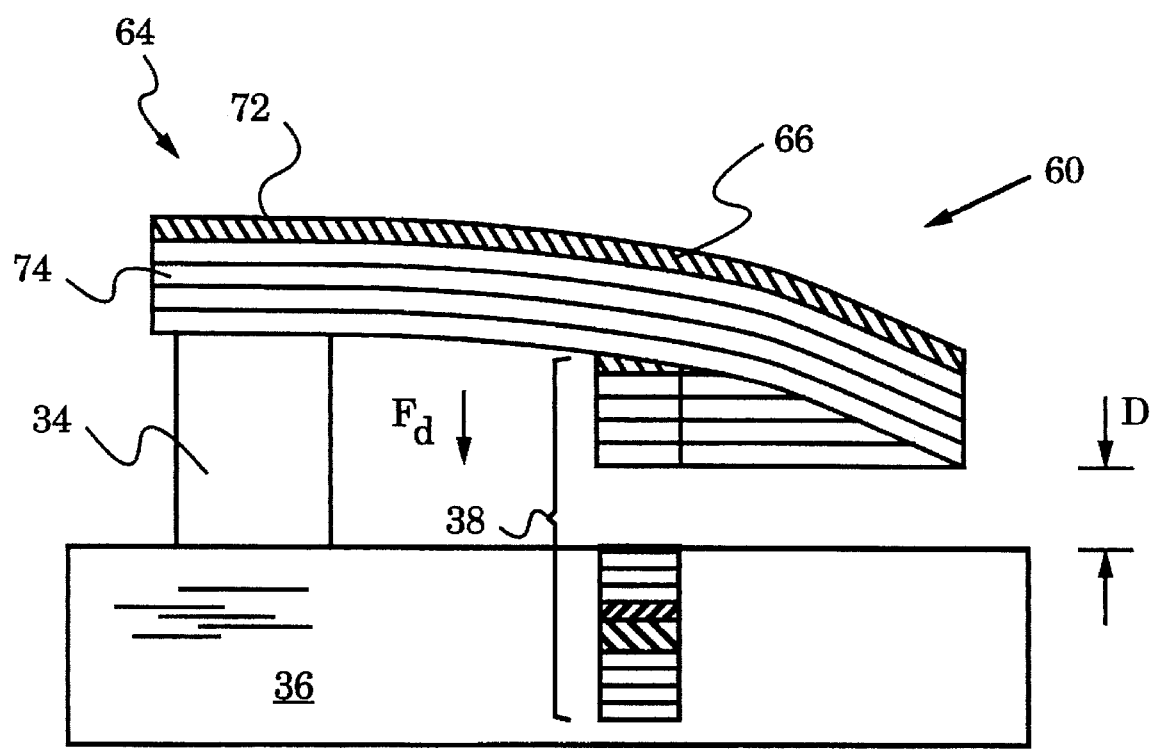
FIG. 2C is a side view of the cantilever of FIG. 2A.

As shown in FIG. 2C, when first tuning voltage $V_{t1}$ is applied to tuning contact 72, vertical force $F_d$ acts on deformable section 66 and on active head 68. Thus, distance D between active head 68 and the portion of Fabry-Perot cavity 38 inside substrate 36 decreases, and consequently the resonance wavelength decreases. Again, the tuning is continuous since tuning voltage $V_{t1}$ can be adjusted continuously. Cantilever structure 62 is less lossy and more efficient than the structure shown in FIG. 1. The geometry of deformable section 66 guarantees a better preservation of parallelism between active head 68 and the remainder of cavity 38, in particular bottom reflector 44. The downward tilt of rectangular portion of deformable section 66 is compensated by the equal and opposite tilt of in-reaching section 70. Thus active head 68 remains parallel to bottom reflector 44 at all values of distance D.

Figure 3A:
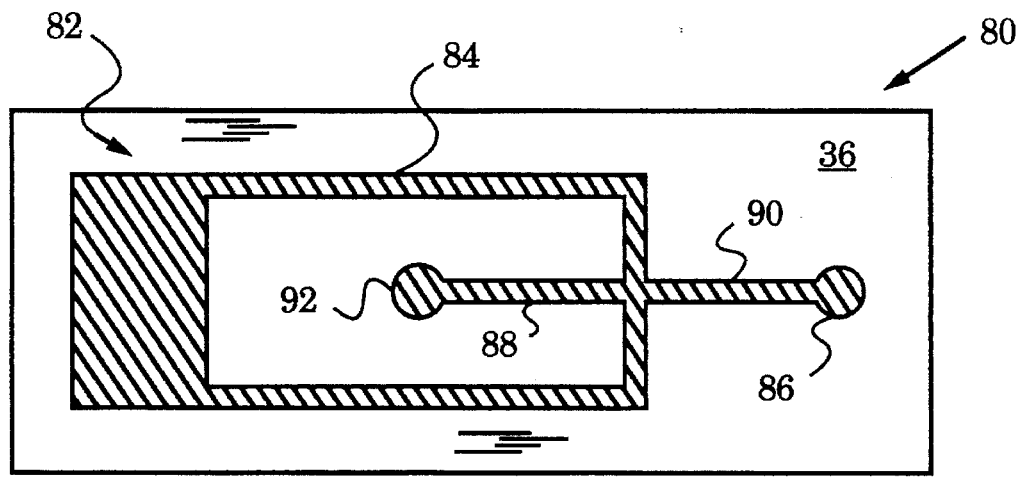
FIG. 3A is a top view of a cantilever apparatus according to the invention having a tuning head and an active head.

An extension of the embodiment of FIG. 2 is shown in FIG. 3A. Once again, a cantilever structure 80 has a base 82, a deformable section 84, and an active head 86. Deformable section 84 has a rectangular circumference as well as an in-reaching portion 88 and an out-reaching portion 90. Active head 86 is located at the end of out-reaching portion 90 over Fabry-Perot cavity 38 (see FIG. 3B). A tuning head 92 is located at the end of in-reaching portion 88. Preferably, tuning head 92 has the same diameter as active head 86. In a particularly preferred embodiment the length of in-reaching portion 88 is one half the length of the rectangular circumference or deformable section 84.

Figure 3B:
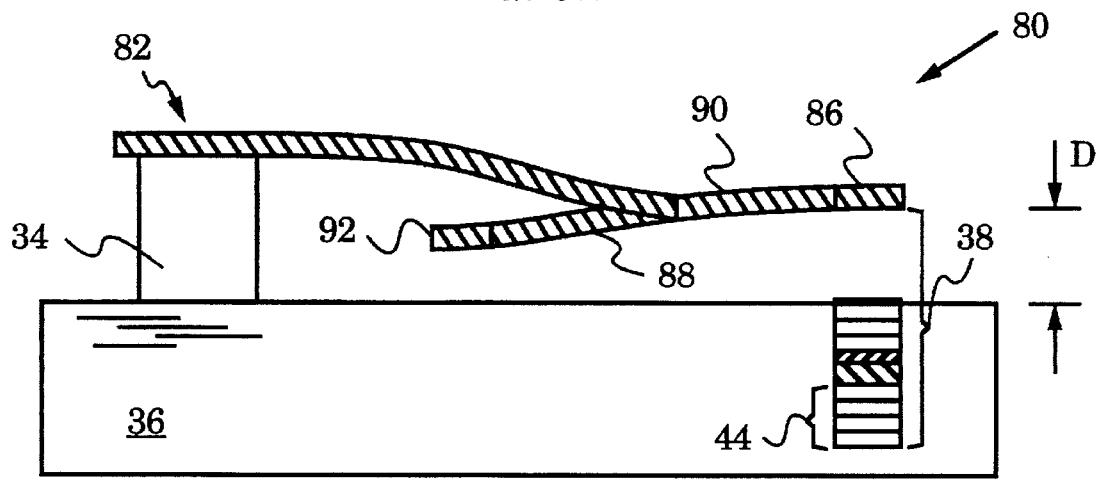
FIG. 3B is a side view of the cantilever of FIG. 3A.

FIG. 3B shows a side view of cantilever structure 80. The Fabry-Perot cavity has all the same components as described above in reference to the first and second embodiments. Parallelism is maintained between active head 86 and bottom reflector 44 by using the tilt caused by the in-reaching portion 88 and tuning head 92 to cancel the tilt caused by the section 84, out-reaching portion 90 and active head 86.

Figure 4:
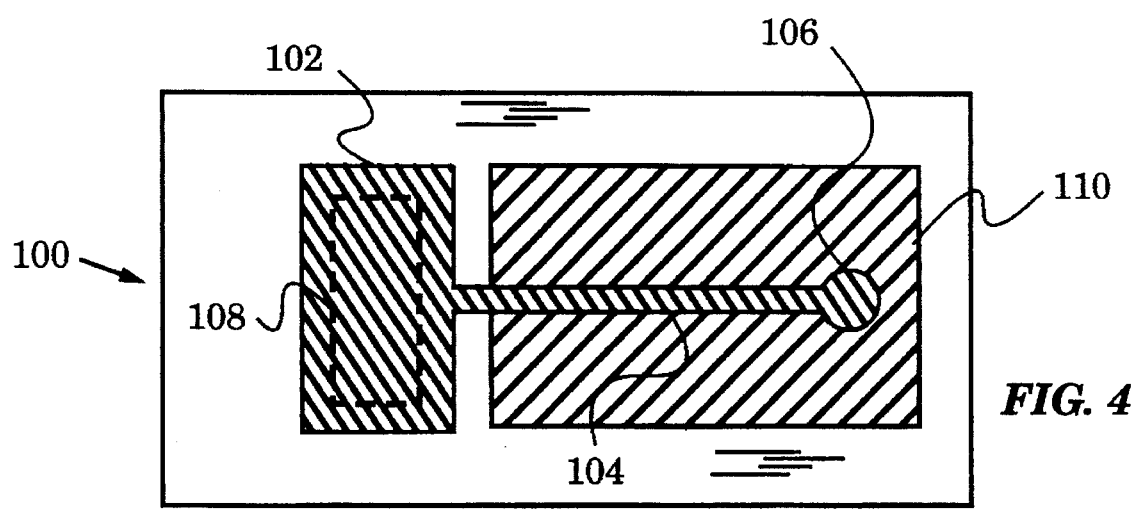
FIG. 4 is a top view of a cantilever apparatus with a patterned substrate according to the invention.

In all implementations, it is advantageous to electrically isolate individual tuning heads from each other. The isolation is necessary in order to allow independent control of each device. Further, in the case of multiple tuning heads on the same device, the isolation allows independent control of the downward force on each tuning head thus permitting one to practice more precise tilt control. Isolation may be achieved by forming independent responsive zones in the cantilever or in the substrate; the latter approach is easier to implement. A possible implementation is shown in FIG. 4 for the case of the simple single-head cantilever and FIG. 5 for a dual-head structure. As seen in FIG. 4, a cantilever structure 100 with a base 102, an arm 104 and an active head 106 is shown in top view. Cantilever structure 100 is supported by a block 108 formed by the sacrificial layer material. The substrate is patterned to provide an independent responsive zone 110 underneath head 106. The patterning ensures that charge accumulation occurs only in responsive zone 110, such that the force on head 106 is due to the interactions between the charges on head 106 and the charges on responsive zone 110. The patterning can be achieved by using oxide confining layers, or employing standard techniques such as isolation etching or proton implantation.

Figure 5:
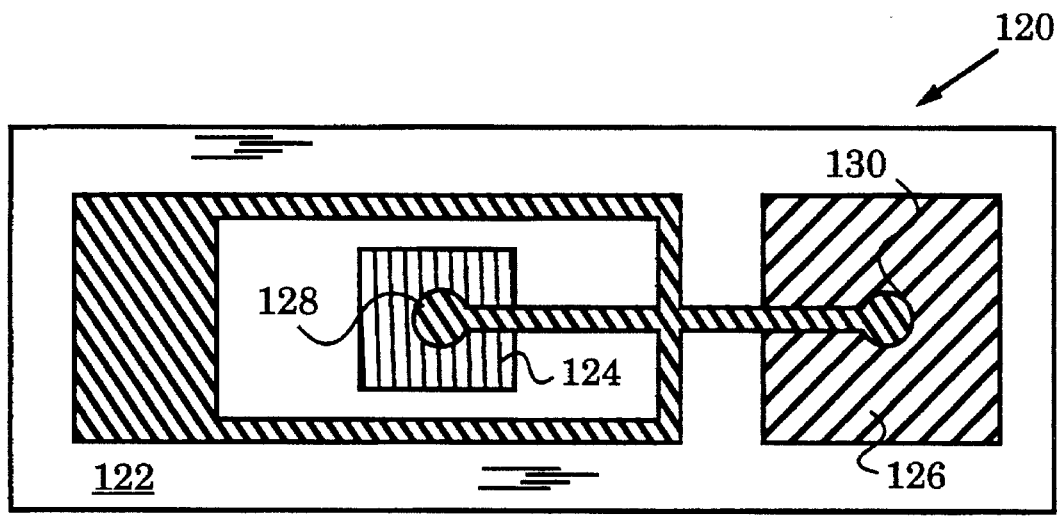
FIG. 5 is a top view of a cantilever apparatus having a patterned substrate with two responsive zones.

FIG. 5 shows a cantilever structure 120 over a substrate 122 patterned with two electrically responsive zones 124 and 126. Zone 124 is located under a tuning head 128 and zone 126 is located under an active head 130. When tuning voltage $V_{t1}$ is applied the vertical force $F_d$ between tuning head 128 and zone 124 will differ from the vertical force $F_d$ between active head 130 and zone 126. The difference between the vertical forces allows for precise adjustment of the tilt and height (D) of active head 130.

Figure 6:
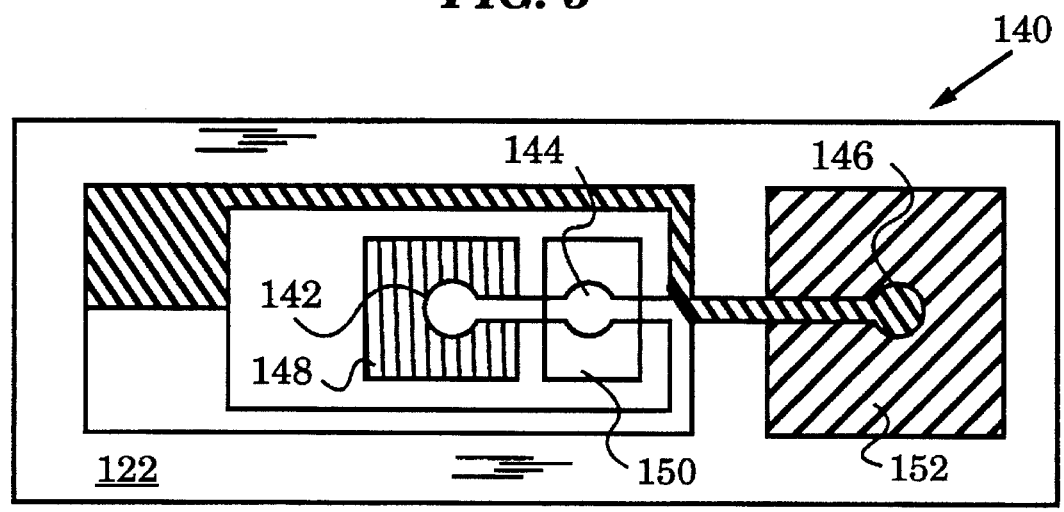
FIG. 6 is a top view of yet another cantilever apparatus having two responsive zones.

It is desirable to decouple tilt and height adjustments. FIG. 6 illustrates a cantilever structure 140 with two tuning heads 142, 144 and an active head 146. Several independent responsive zones (148, 150, 152) are located under each of these tuning heads allowing independent control of the forces acting on each head. Heads 142 and 146 are used primarily for tilt adjustment, while head 144 is used primarily for height adjustment.

Figure 7:
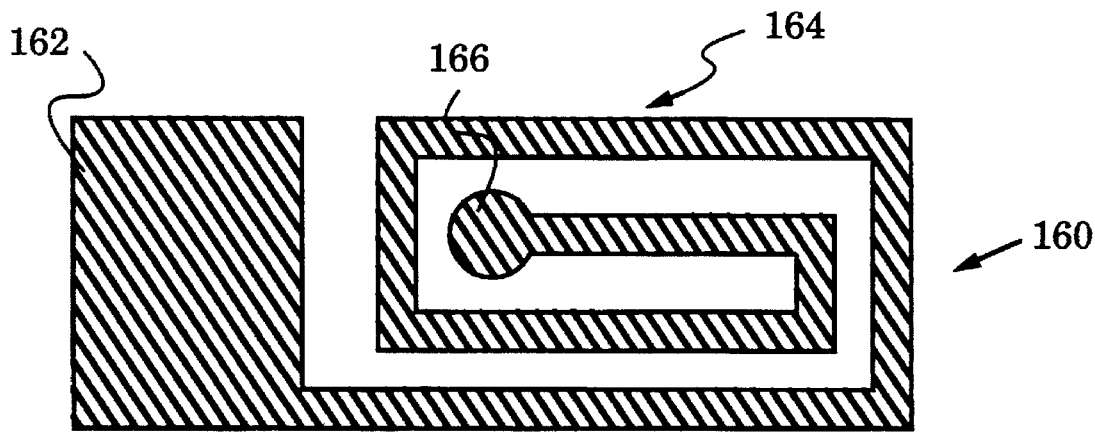
FIG. 7 is a top view of a spiral-shaped cantilever structure according to the invention.
Figure 8A:
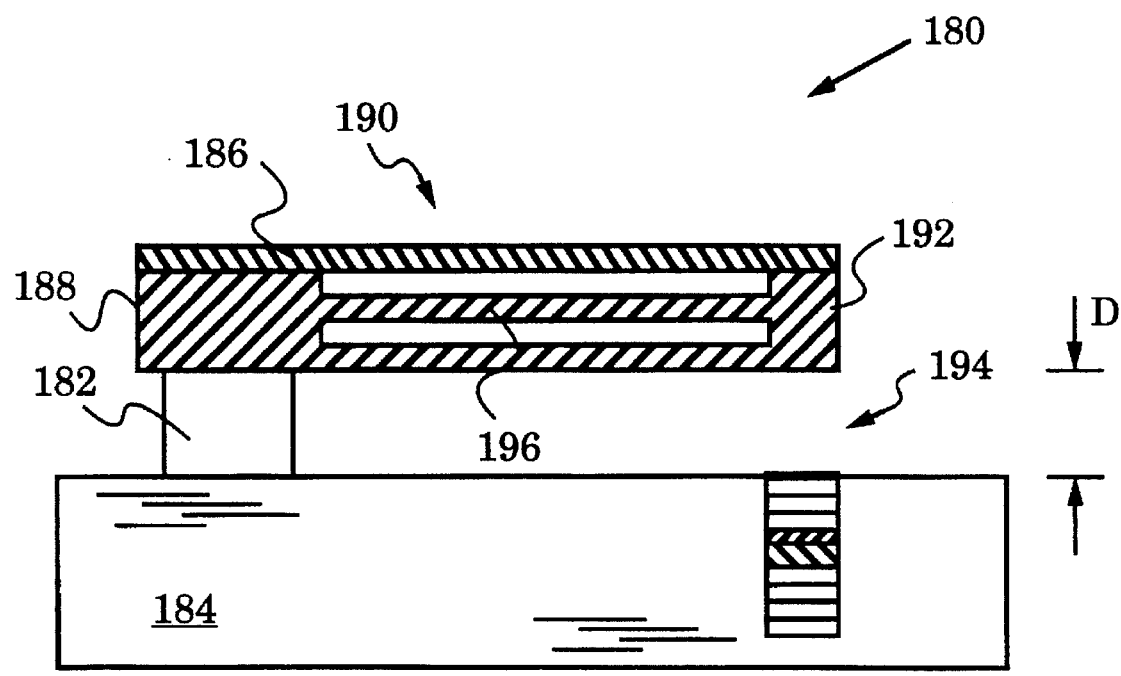
FIG. 8A is a side view of a cantilever apparatus with a deformable section having a plurality of interspaced parallel arms.
Figure 8B:
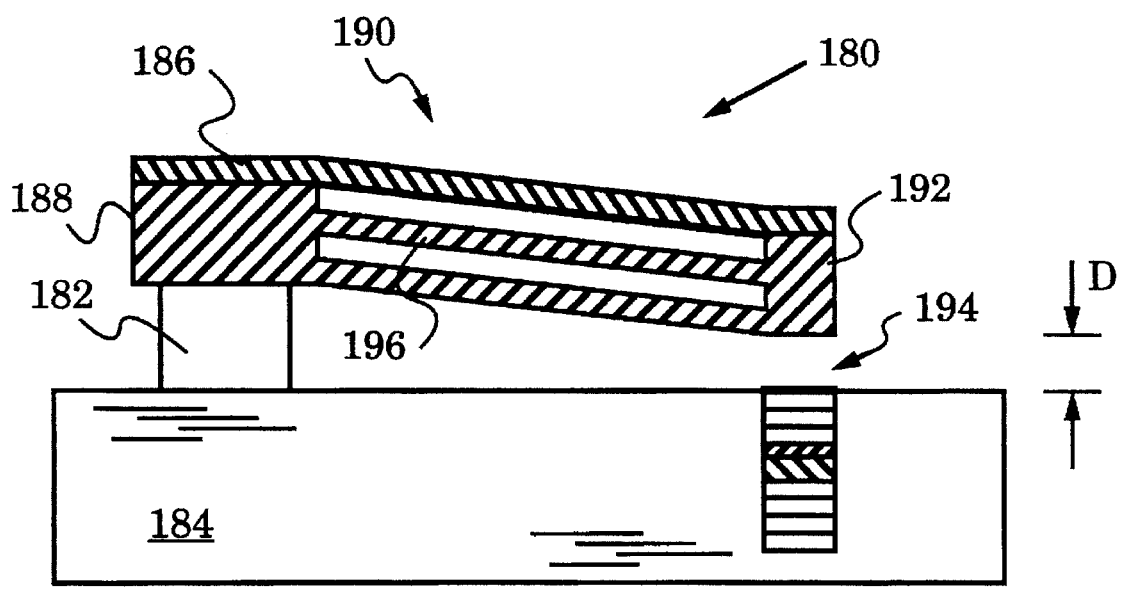
FIG. 8B is a side view of the cantilever apparatus of FIG. 8A with lowered active head.

FIG. 7 shows a cantilever structure 160 with a rectangular base 162, a spiral-shaped deformable section 164 and an active head 166. This geometry of section 164 is particularly advantageous in offsetting any tilt of active head 166 with respect to the cavity (not shown), FIGS. 8A and 8B illustrate, in a side view, yet another advantageous embodiment of the invention. As before, a cantilever structure 180 is mounted on a support block 182 which sits on an electrically responsive substrate 184. A tuning contact 186 for applying a tuning voltage $V_{t1}$ covers the top of cantilever structure 180. Cantilever structure 180 has a base 188, a deformable section 190, and an active head 192 positioned above a Fabry-Perot cavity 194.

The bulk of cantilever structure 180 consists of a plurality of alternating layers (not shown). In deformable section 190 two of the alternating layers are etched away according to conventional etching techniques, yielding three interspaced parallel arms 196. Viewed from a side sectional view, section 190 is then a deformable parallelogram: the angle between the sides of the parallelogram can change, while the sides of the parallelogram remain rigid.

As shown in FIG. 8B, when tuning voltage $V_{t1}$ is applied to tuning contact 186 active head 192 moves down. Since section 190 is a deformable parallelogram, active head 192 does not tilt as it descends. Of course, two arms or more than three arms similar to arms 196 would also prevent the tilting of the active head. In addition, formerly discussed measures to control the tilt of active head 192 and D above Fabry-Perot cavity 194 can be added in this embodiment.

Figure 9A:
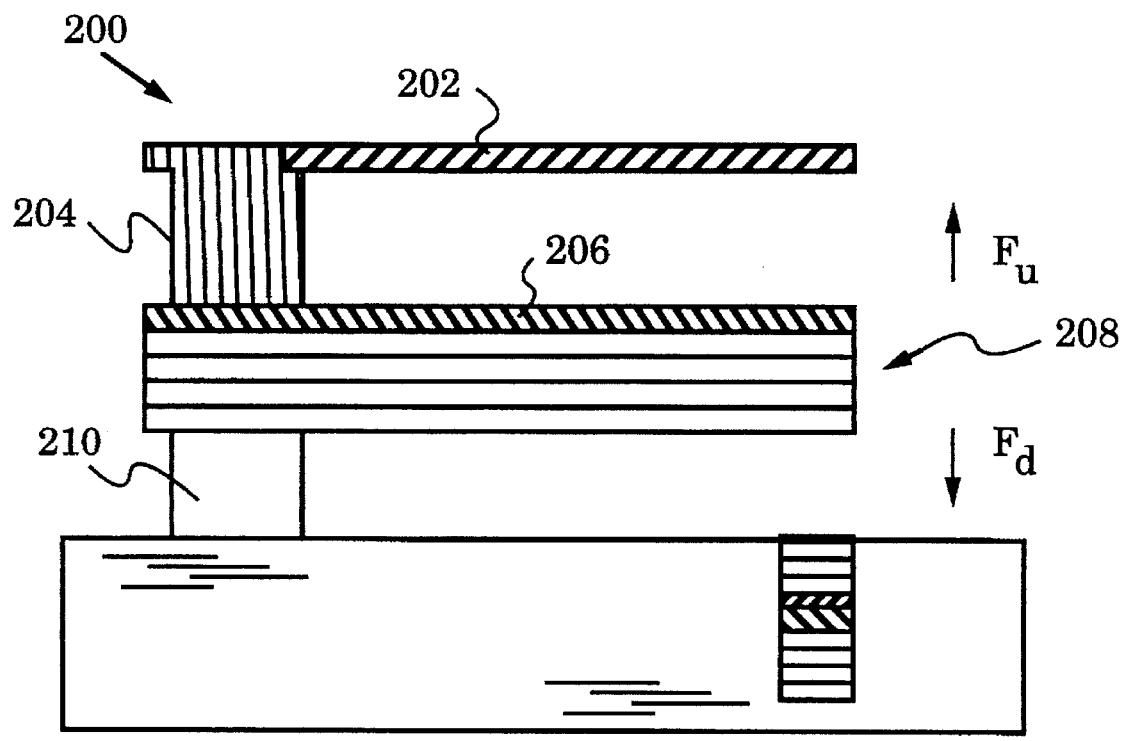
FIG. 9A is a side view of a cantilever apparatus with a top electrode.
Figure 9B:
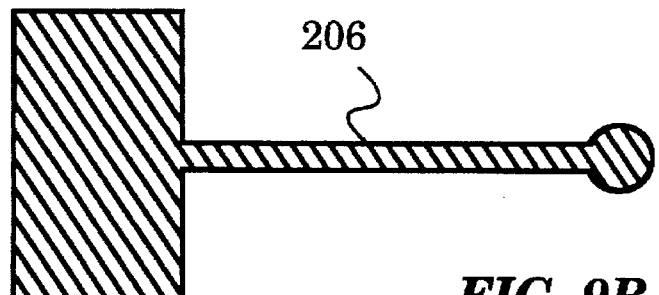
FIG. 9B ms a top view of the cantilever structure of cantilever apparatus of FIG. 9A.
Figure 9C:
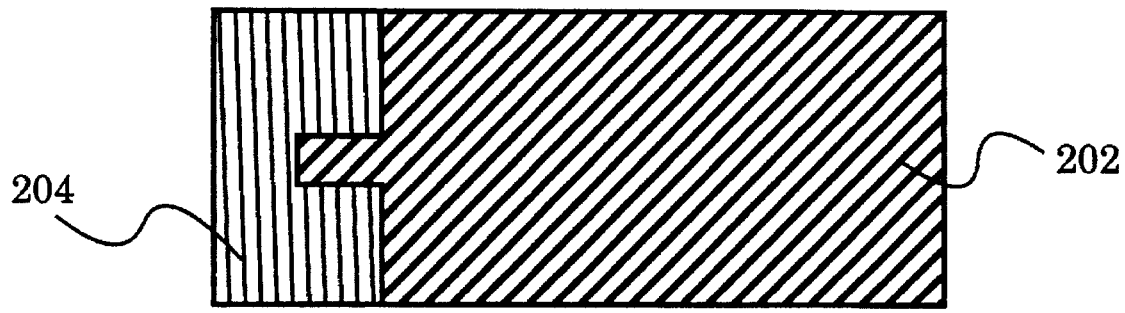
FIG. 9C ms a top view of the top electrode of the cantilever apparatus of FIG. 9A.

FIG. 9A illustrates an embodiment employing two electrodes. A cantilever apparatus 200 is analogous to cantilever apparatus 20 of FIG. 1C, except for a top electrode 202 and a block 204 for supporting electrode 202. FIG. 9B shows a top view of a horizontal cross-section cut through block 204. FIG. 9C shows the top view of the entire structure. Cantilever apparatus 200 has a tuning contact 206 deposited on a cantilever structure 208. Cantilever structure 208, in turn, is positioned on a support block 210.

Block 204 forms a part of electrical tuning contact 206 and is made of the same material as tuning contact 206. The height of block 204 is approximately equal to the height of support block 210. Top electrode 202 extends laterally from the top of block 204 and parallel to cantilever structure 208.

During operation a first tuning voltage $V_{t1}$ is applied to tuning contact 206, and a second tuning voltage $Vt_2$ is applied to top electrode 202. Second tuning voltage $V_{t2}$ produces a vertical upward force $F_u$, while first tuning voltage $V_{t1}$ generates a vertical downward force $F_d$. Proper selection of tuning voltages $V_{t1}$ and $Vt_2$ thus allows deflection of cantilever structure 208 both upward and downward. If cantilever 208 is patterned with multiple tuning contacts, tilt compensation may be achieved by proper balance of upward and downward forces on the different cantilever sections. Further, the device of FIG. 9 consists of two coupled-cavities with tunable cavity lengths. This provides capability for linewidth broadening and interferometric wavelength selection which can be used to obtain discrete wavelength tuning or broader tuning ranges if desired.

Figure 10A:
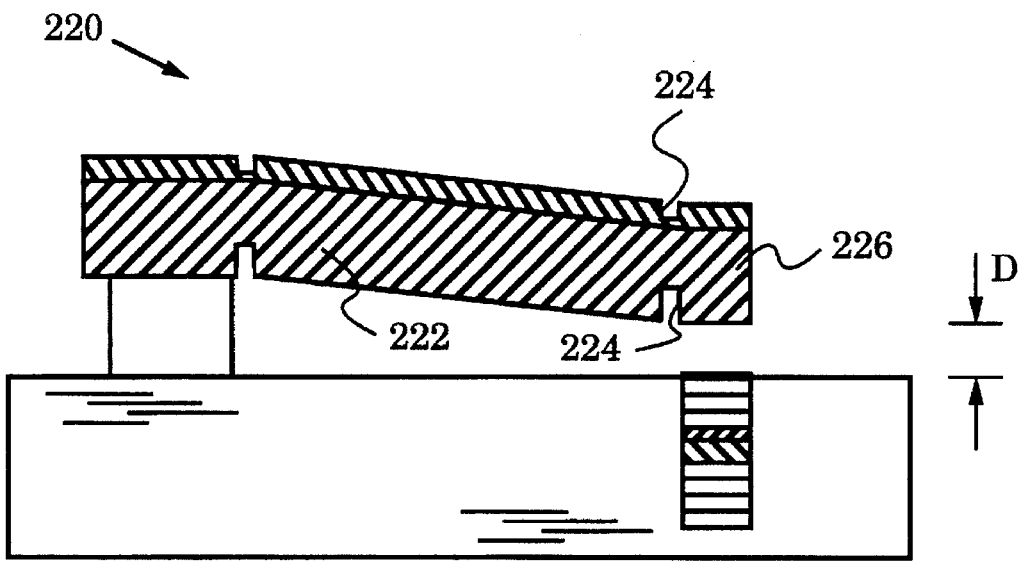
FIG. 10A is a side view of a cantilever apparatus in which the arm has notches.
Figure 10B:
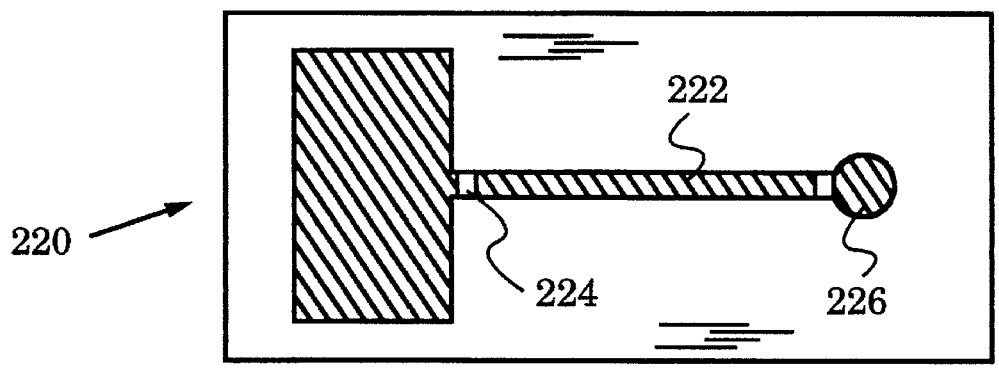
FIG. 10B is a top view of the cantilever apparatus of FIG. 10A.

FIGS. 10A and 10B are, respectively, a side and a top sectional view of yet another embodiment designed to reduce the tilt of the active head of the cantilever structure. A cantilever structure 220 has a deformable arm 222 defined by notches 224 on the surface of the semiconductor. Notches 224 also facilitate the bending of arm 222. Arm 222 is a deformable parallelogram, and it prevents the tilting of the active head 226 as distance D decreases.

Figure 11:
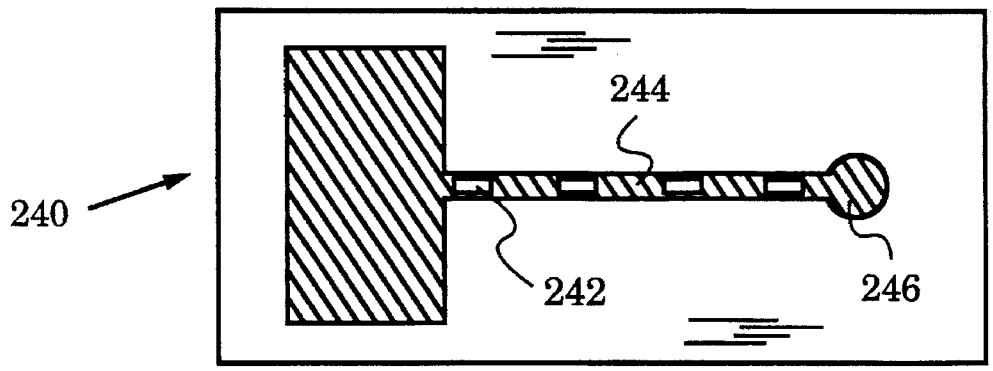
FIG. 11 is a top view of a cantilever apparatus with cut-outs in the arm.

FIG. 11 is a top sectional view of an embodiment wherein the tilting of the active head 240 is avoided by making a number of cut-outs 242 in a deformable arm 244, and thereby defining several deformable sections in arm 244.

The embodiments described above can be easily manufactured using conventional techniques. These include chemical vapor deposition (CVD), molecular beam epitaxy (MBE), metal-organic chemical vapor deposition (MOCVD), wet and dry etching processes, and regrowth. It is particularly advantageous to use dry etching in manufacturing the cantilever structures, due to their mechanical fragility. A person skilled in the art of manufacturing solid state VCSELs will be able to choose the appropriate technique in each case.

The tunable Fabry-Perot cavity described above can be used as a lasing cavity (if an active layer is present), as a filter, or as part of a wavelength detector (using a photodiode). If the device is fabricated as a detector in any of the above embodiments, then it may be biased to operate in either of two modes. In the first mode, the device is tuned to respond to a fixed wavelength. In the second mode, the device is tuned to a nominal wavelength and then it self-adjusts its tuning bias to allow its resonant wavelength to track the wavelength of the incident light. In both modes, the detector responds to a narrow spectral passband about the center wavelength. The resonant wavelength is determined by the thickness of the air spacer layer, which in turn is determined by the voltage difference between the cantilever and the top substrate layers.

Figure 12:
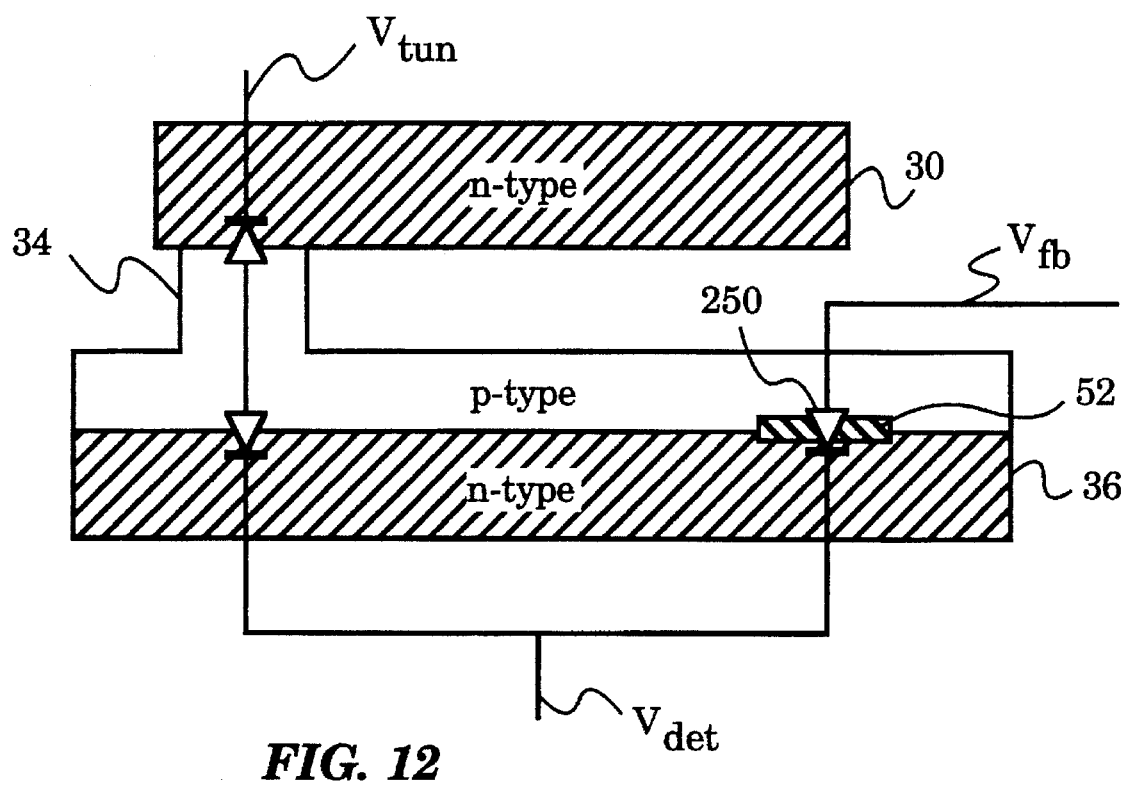
FIG. 12 is a schematic side view of a tunable detector using a cantilever apparatus showing the equivalent circuit.

The electrical circuit of a detector of the present invention is shown in FIG. 12, superimposed on a schematic side view of a simplified cantilever structure similar to the one shown in FIG. 1. The device is doped as a n-p-n junction with a contact for each differently-doped layer. Cantilever layers 30 are n-doped, while substrate 36 is p-doped above active medium 52 and n-doped below active medium 52. The cantilever tuning is controlled by the difference between the top n-contact voltage, $V_{tun}$, and the middle p-contact voltage, $V_{fb}$. The voltage difference $V_{tun}-V_{fb}$ is equal to the previously discussed voltage $V_{t1}$. A photodiode 250 (the light detector) is formed from the bottom p-n junction. The detector bias is determined by the difference between the middle p-contact voltage, $V_{fb}$, and the bottom n-substrate contact voltage, $V_{det}$.

Figure 13A:
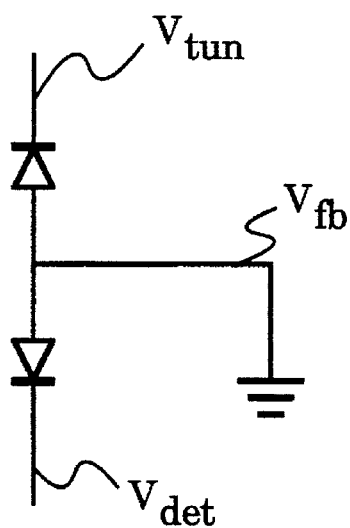
FIG. 13A is an equivalent circuit of the tunable detector under a first biasing scheme.
Figure 13B:
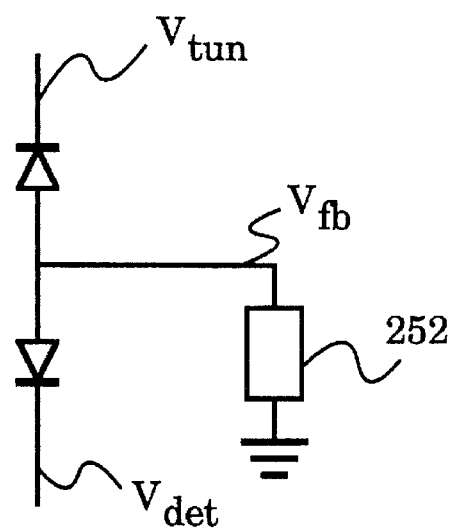
FIG. 13B is an equivalent circuit of the tunable detector under a second biasing scheme.

The equivalent circuits of the two biasing schemes are shown in FIGS. 13A and 13B. For operation without wavelength tracking, $V_{fb}$ is fixed at ground as shown in FIG. 13A. The cantilever tuning is determined by the difference between $V_{tun}$ and $V_{fb}$. The thickness of the air gap, which dictates the cavity resonance wavelength, is determined strictly by the applied voltage $V_{tun}$. For operation with wavelength tracking, $V_{fb}$ is connected to ground through a feedback load 252 as shown in FIG. 13B. Because feedback load 252 and the detector are connected in series, the current flowing between the two must be equal. Consequently, $V_{fb}$ is determined from the photocurrent through feedback load 252. Thus, if the cavity is tuned to a wavelength just long of the nominal resonance and the wavelength of the incident light subsequently increases, the photocurrent will initially increase as the cavity becomes more resonant. However, as the photocurrent increases, $V_{fb}$ also increases for a resistive load. As a result, the electrostatic force on the cantilever decreases, which leads to an increase in the air gap thickness. Thus, the inclusion of feedback load 252 allows the detector to self-adjust the wavelength tuning bias condition to change the cavity resonant wavelength in response to changes of the incident light wavelength. Further, because $V_{fb}$ varies as a function of the incident wavelength, the measurement of $V_{fb}$ can be used to determine the incident wavelength. Consequently, the detector can be used as a wavelength meter.

SUMMARY, RAMIFICATIONS, AND SCOPE

There are many ways to build an apparatus similar to the one described above, without departing from the spirit of the invention. Therefore, the scope of the invention should be determined, not by examples given, but by the appended claims and their legal equivalents.

We claim:

1. A cantilever apparatus for tuning a resonance wavelength of a Fabry-Perot cavity, said Fabry-Perot cavity comprising a bottom reflecting means and a top reflecting means, said cantilever apparatus comprising:
    a) an electrically responsive substrate;
    b) a support block positioned on said electrically responsive substrate;
    c) a cantilever structure comprising a base section resting on said support block, a deformable section extending above said electrically responsive substrate and creating an air gap between said deformable section and said electrically responsive substrate, and an active head positioned at a predetermined location on said deformable section and comprising at least a portion of said top reflecting means;
    d) an electrical tuning contact disposed on said cantilever structure for applying a first tuning voltage $V_{t1}$ to produce a vertical electrostatic force $F_d$ between said electrical tuning contact and said electrically responsive substrate, thereby altering the size of said air gap and tuning said resonant wavelength.

2. The cantilever apparatus of claim 1 wherein said electrical tuning contact covers said deformable section and said active head.

3. The cantilever apparatus of claim 2 wherein said deformable section is an arm and said active head is located at the free end of said arm.

4. The cantilever apparatus of claim 2 wherein said deformable section comprises a substantially rectangular circumference with a central passage and an in-reaching portion projecting from said substantially rectangular circumference opposite said base section into said central passage, and wherein said active head is located on said in-reaching portion.

5. The cantilever apparatus of claim 2 wherein said deformable section comprises a substantially rectangular circumference with a central passage, an in-reaching portion projecting from said substantially rectangular circumference opposite said base section into said central passage, and an out-reaching portion projecting from said substantially rectangular circumference opposite said in-reaching portion and away from said central passage, and wherein said active head is located on said out-reaching portion.

6. The cantilever apparatus of claim 5 further comprising at least one tuning head located on said in-reaching portion and covered with said electrical tuning contact.

7. The cantilever apparatus of claim 2 wherein said deformable section comprises a spiral and said active head is located at the free end of said spiral.

8. The cantilever apparatus of claim 1 wherein said electrical tuning contact is patterned to form at least two electrically isolated tuning regions.

9. The cantilever apparatus of claim 8 wherein said deformable section is an arm and said active head is located at the free end of said arm, and wherein a first tuning region extends along said arm and terminates before said active head, and a second tuning region extends along said arm and covers said active head.

10. The cantilever apparatus of claim 8 wherein said deformable section comprises a substantially rectangular circumference with a central passage, an in-reaching portion projecting from said substantially rectangular circumference opposite said base section into said central passage, and an out-reaching portion projecting from said substantially rectangular circumference opposite said in-reaching portion and away from said central passage, and wherein said active head is located on said out-reaching portion.

11. The cantilever apparatus of claim 10 further comprising at least one tuning head located on said in-reaching portion and covered with one of said at least one tuning regions.

12. The cantilever apparatus of claim 10 wherein said active head is located at the end of said out-reaching portion and a tuning head is located at the end of said in-reaching portion, and wherein said tuning head is covered with one of said at least one tuning regions different from the tuning region covering said active head.

13. The cantilever apparatus of claim 12 wherein said out-reaching portion is approximately one third the length of said substantially rectangular circumference and said out-reaching portion is one tenth the length of said in-reaching portion.

14. The cantilever apparatus of claim 8 wherein said deformable section comprises a spiral and said active head is located at the free end of said spiral.

15. The cantilever apparatus of claim 1 wherein said electrically responsive substrate is patterned substantially at its surface to form at least two electrically isolated responsive zones.

16. The cantilever apparatus of claim 15 further comprising a tuning head located on said deformable portion and two responsive zones; a first responsive zone located underneath said active head and a second responsive zone located underneath said tuning head.

17. The cantilever apparatus of claim 1 wherein said electrically responsive substrate is doped with a positive charge carrier and said electrical tuning contact is doped with a negative charge carrier, thereby producing a pn-junction between said electrically responsive substrate and said electrical tuning contact.

18. The cantilever apparatus of claim 1 wherein said electrically responsive substrate is doped with a negative charge carrier and said electrical tuning contact is doped with a positive charge carrier, thereby producing a pn-junction between said electrically responsive substrate and said electrical tuning contact.

19. The cantilever apparatus of claim 1 further comprising a top electrode positioned above said cantilever structure for applying a second tuning voltage $V_{t2}$ to produce a vertical electrostatic force $F_u$ between said electrical contact and said top electrode thereby altering the size of said air gap and tuning said resonant wavelength.

20. The cantilever apparatus of claim 1 wherein said deformable section is provided with notches for facilitating the bending of said deformable section.

21. The cantilever apparatus of claim 1 wherein said deformable section is provided with cut-outs for facilitating the bending of said deformable section.

22. The cantilever apparatus of claim 1 wherein said deformable section comprises a plurality of interspaced parallel arms.

23. A method for tuning a resonance wavelength of a Fabry-Perot cavity using a cantilever structure comprising a base section, a deformable section, and an active head, said Fabry-Perot cavity comprising a bottom reflecting means and a top reflecting means, said method comprising the steps of:

a) positioning a support block on an electrically responsive substrate containing said Fabry-Perot cavity;

b) producing said cantilever structure on said support block such that said active head contains at least a portion of said top reflecting means and is positioned above said Fabry-Perot cavity, and said deformable section extends above said electrically responsive substrate and creates an air gap between said deformable section and said electrically responsive substrate;

c) disposing an electrical tuning contact on said cantilever structure;

d) applying a first tuning voltage $V_{t1}$ to produce a vertical electrostatic force $F_d$ between said electrical tuning contact and said electrically responsive substrate, thereby altering the size of said air gap and tuning said resonant wavelength.

24. The method of claim 23, wherein said Fabry-Perot cavity is used for determining the wavelength of light incident on said Fabry-Perot cavity.

25. The method of claim 23, wherein said Fabry-Perot cavity is used as a lasing cavity.

\* \* \* \* \*